United States Patent
Hwang et al.

(10) Patent No.: US 7,042,289 B2
(45) Date of Patent: May 9, 2006

(54) TRANSCONDUCTANCE CONTROL CIRCUIT OF RAIL-TO-RAIL DIFFERENTIAL INPUT STAGES

(75) Inventors: Jong-Tae Hwang, Seoul (KR); Dong-Hwan Kim, Bucheon (KR); Yun-Kee Lee, Bucheon (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 9 days.

(21) Appl. No.: 10/817,705

(22) Filed: Apr. 2, 2004

(65) Prior Publication Data

US 2004/0239423 A1    Dec. 2, 2004

(30) Foreign Application Priority Data

May 26, 2003    (KR) .................. 10-2003-0033407

(51) Int. Cl.
*H03F 3/45*    (2006.01)

(52) U.S. Cl. .................. 330/253; 330/254; 330/261

(58) Field of Classification Search ............ 330/253, 330/261, 254, 285, 296
See application file for complete search history.

(56) References Cited

U.S. PATENT DOCUMENTS

| 4,797,631 | A | * | 1/1989 | Hsu et al. ............. 330/253 |
| 4,887,048 | A | * | 12/1989 | Krenik et al. ......... 330/258 |
| 5,334,948 | A | * | 8/1994 | Fong et al. ........... 330/253 |
| 5,371,474 | A | * | 12/1994 | Wassenaar et al. ..... 330/253 |
| 5,384,548 | A | * | 1/1995 | Sakurai et al. ........ 330/253 |
| 5,631,607 | A | * | 5/1997 | Huijsing et al. ....... 330/253 |
| 5,642,078 | A | * | 6/1997 | Navabi et al. ......... 330/253 |
| 5,847,607 | A | * | 12/1998 | Lewicki et al. ........ 330/258 |
| 6,124,760 | A | * | 9/2000 | Hong .................. 330/253 |
| 6,288,282 | B1 | * | 9/2001 | Rheude et al. ......... 568/343 |
| 6,496,067 | B1 | * | 12/2002 | Behzad et al. ......... 330/253 |
| 6,509,796 | B1 | * | 1/2003 | Nguyen et al. ......... 330/254 |

* cited by examiner

*Primary Examiner*—Rexford Barnie
*Assistant Examiner*—Lam T. Mai
(74) *Attorney, Agent, or Firm*—Sidley Austin LLP

(57) ABSTRACT

A transconductance control circuit of a rail-to-rail differential input stage is described. The transconductance control circuit senses the gate-source voltages of PMOS and NMOS differential pairs, converts the sensed voltage to a current, compares the current with a reference current, and controls the currents of the PMOS and NMOS differential pairs to control the transconductance of the RTR differential input stage. Also, various types of biasing techniques and matching techniques are used to reduce the variations of the transconductance.

15 Claims, 8 Drawing Sheets

Prior Art

TRANSCONDUCTANCE CONTROL CIRCUIT OF RAIL-TO-RAIL DIFFERENTIAL INPUT STAGES

CROSS REFERENCE TO RELATED APPLICATION

This application claims priority to and the benefit of Korea Patent Application No. 2003-33407 filed on May 26, 2003 in the Korean Intellectual Property Office, the content of which is incorporated herein by reference.

BACKGROUND OF THE INVENTION (a) Field of the Invention

The present invention relates to a differential amplifier. More specifically, the present invention relates to a transconductance control circuit of rail-to-rail differential input stages of an operational amplifier.

(b) Description of the Related Art

The input stage of a low-voltage amplifier processes a rail-to-rail (RTR) common mode input voltage to overcome a restricted swing range. An NMOS differential pair and a PMOS differential pair are coupled in parallel to obtain an RTR common mode input voltage swing. The operating range can be extended to a higher voltage level by using the NMOS differential pair and the operating range can be extended to a lower voltage level by using the PMOS differential pair. A differential pair, which has an input range extending from a negative supply rail to a positive supply rail is referred to as an RTR transconductor.

A common mode input range of an RTR differential input stage consists of three parts. The first one is a low common-mode input voltage part for operating the PMOS differential pair, the second one is an intermediate common-mode input voltage part for operating the PMOS and NMOS differential pairs, and the third one is a high common-mode input voltage part for operating the NMOS differential pair. When a common-mode input voltage moves from one part to another, the corresponding transconductance (referred to as Gm hereinafter) changes by about 100%.

FIG. 1 shows a configuration of a conventional RTR differential input stage, which includes a PMOS and an NMOS differential pair. The NMOS differential pair comprises NMOS transistor M1 10 and NMOS transistor M2 20 to extend the operating range to a maximum voltage level. The PMOS differential pair comprises PMOS transistor M3 30 and PMOS transistor M4 40 to extend the operating range to a minimum voltage level. Current source IP 50 and current source IN 60 power the differential input stage.

The operating voltages of current source IP 50 and current source IN 60 are respectively denoted as Vp and Vn, the gate-source voltages of the NMOS transistors 10 and 20 and the PMOS transistors 30 and 40 are respectively denoted as VGS,n and VGS,p. Finally, the Vcm common-mode voltage is defined as [(V+)+(V−)]/2. The operating range of the differential pair of the RTR differential input stage is as follows. First, in the case of a low common-mode input voltage (Vcm), that is, when Vcm>VA=Vn+VGS,n, the NMOS differential pair is operated. Second, when VA<Vcm<VB, both the NMOS and PMOS differential pairs are operated. The transconductance Gm in this second operating case is:

$$Gm = \frac{\partial[(I1-I2)+(I3-I4)]}{\partial Vin} \quad (1)$$
$$= \frac{\partial(I1-I2)}{\partial Vin} + \frac{\partial(I3-I4)}{\partial Vin}$$
$$= Gm,n + Gm,p$$

Third, in the case of a high common-mode input voltage of Vcm<VB=Vp+VGS,p, the PMOS differential pair is operated. In Equation (1) Vin is a differential input voltage, defined as [(V+)−V(−)]/2. Gm,n and Gm,p are given by Equations 2 and 3 derived according to a MOS transistor quadratic equation:

$$Gm,n = \sqrt{2\mu_n Cox\left(\frac{W}{L}\right)_n IN} = kn\sqrt{IN} \quad (2)$$

$$Gm,p = \sqrt{2\mu_p Cox\left(\frac{W}{L}\right)_p IP} = Kn\sqrt{IP} \quad (3)$$

where $\mu_n$ and $\mu_p$ are the mobility of electrons and holes respectively, (W/L)n and (W/L)p are aspect ratios of a channel length L and channel width W of the NMOS and PMOS transistors respectively, and Cox is the oxide capacitance. The total transconductance is found from Equations 1–3 (for VA<Vcm<VB) as:

$$Gm = Kn\sqrt{IN} + Kp\sqrt{IP} \quad (4)$$

where Kn and Kp are functions of the sizes and mobilities of the corresponding MOS transistors. Therefore, the same Kn and Kp can obtained by appropriately selecting the respective sizes of the PMOS and NMOS transistors. Through this analysis, the transconductance of Vcm for the case of IP=IN=I is:

$$Vcm<Vn+VGS,n:\ Gm=Kp\sqrt{IP}=K\sqrt{IP}=K\sqrt{I} \quad (5.1)$$

$$Vn+VGS,n<Vcm<Vp+VGS,p:\ Gm=Kn\sqrt{IN}+Kp\sqrt{IP}=2K\sqrt{I} \quad (5.2)$$

$$Vp+VGS,p<Vcm:\ Gm=Kn\sqrt{IN}=K\sqrt{IN}=K\sqrt{I} \quad (5.3)$$

FIG. 2 shows a graph of Gm as a function of Vcm according to Equation 5. As shown, the values of Gm vary by about 100% as Vcm varies in its allowed range. A unity gain frequency of the amplifier is proportional to the Gm of the input stage. Accordingly, variations of the transconductance Gm interfere with optimizing the frequency compensation. Hence, the frequency compensation can be optimized by monitoring and maintaining a steady input stage Gm, independent of variations of Vcm. In contrast, in some existing circuits Gm varies quite abruptly.

SUMMARY OF THE INVENTION

It is an aspect of the present invention to provide a simple control circuit with an essentially constant transconductance over the entire range of a common mode input voltage.

It is another aspect of the present invention to provide a stable control circuit with an essentially constant transconductance through a new biasing technique.

In one aspect of the present invention, a transconductance control circuit of a rail-to-rail differential input stage includes: a rail-to-rail differential input stage including first and second differential pairs and a current supply unit coupled to the sources of the first and second differential pairs for supplying a bias current. The control circuit further includes a transconductance controller for sensing a first gate-source voltage of the first differential pair and a second gate-source voltage of the second differential pair. The transconductance controller compares a reference current with a current that corresponds to the sum of the first gate-source voltage and the second gate-source voltage, and controls the currents of the first and second differential pairs according to the comparison.

Also, in order to generate an essentially constant transconductance of the rail-to-rail differential input stage, the reference current of the transconductance controller is generated by the replica biasing or dynamic biasing technique, and a matching technique is used for improving matching states.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only some embodiments of the invention are described, simply by way of illustration contemplated by the inventors. As will be realized by persons skilled in the arts, numerous modifications are conceivable in various obvious respects, all without departing from the invention. Accordingly, the drawings and description are to be regarded as only illustrative in nature, and not limiting.

First, an RTR differential input stage circuit with an essentially constant transconductance according to an embodiment will be described in detail.

Figure 3:
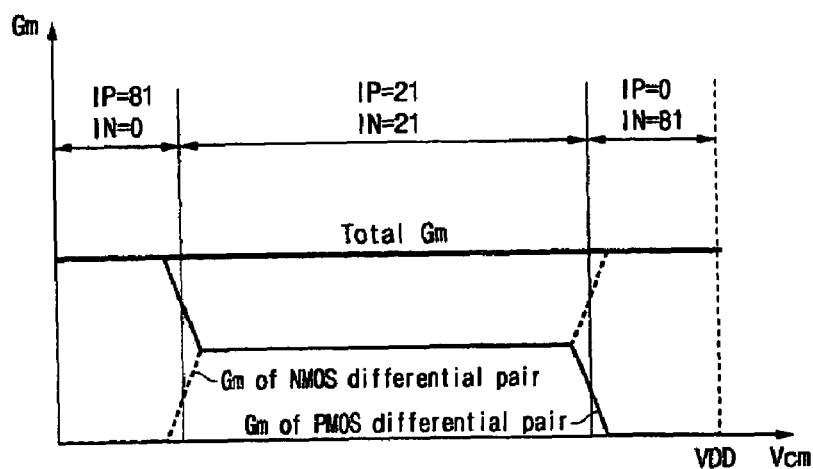
FIG. 3 shows variations of the transconductance according to an embodiment of the present invention.

FIG. 3 shows characteristics of the differential pair for maintaining the values of Gm of the RTR differential input stage independent of the common mode voltage Vcm.

A steady Gm of the RTR differential input stage is achieved by varying current sources IP and IN according to the variation of the common mode voltage Vcm. FIG. 3 shows the variation of IP and IN. These currents also satisfy:

$$\sqrt{IN}+\sqrt{IP}=\text{Const.} \qquad (6)$$

Equation 6 can be rewritten as:

$$\frac{2}{K}\sqrt{IN} + \frac{2}{K}\sqrt{IP} = \text{Const.} \qquad (7)$$

By adding the threshold voltages of the NMOS and PMOS transistors one obtains:

$$\frac{2}{K}\sqrt{IN} + VTN + \frac{2}{K}\sqrt{IP} + VTP = \text{Const.} \qquad (8)$$

where VTN and VTP are the threshold voltages of the NMOS and PMOS transistors, respectively. Algebraic manipulations of Equation 8 give:

$$VGS,n+VGS,p=\text{Const.} \qquad (9)$$

where VGS,n is the gate-source voltage of M1 10 and M2 20 and VGS,p is the gate-source voltage of M3 30 and M4 40. According to Equation 9, the value of VGS,n+VGS,p is kept constant independent of the variations of the common mode voltage in order to keep Gm of the RTR differential input pair essentially steady.

Next, a differential input stage with an essentially constant Gm will be described by using the above results.

Figure 1:
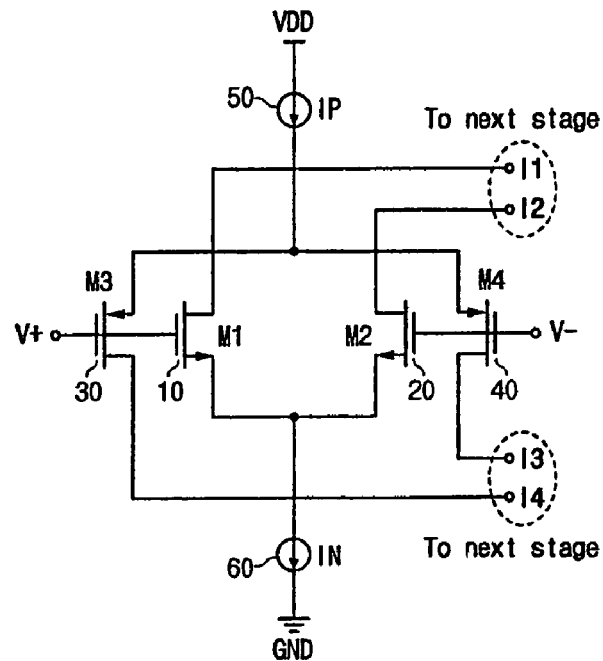
FIG. 1 shows a configuration of a conventional rail-to-rail differential input stage.
Figure 2:
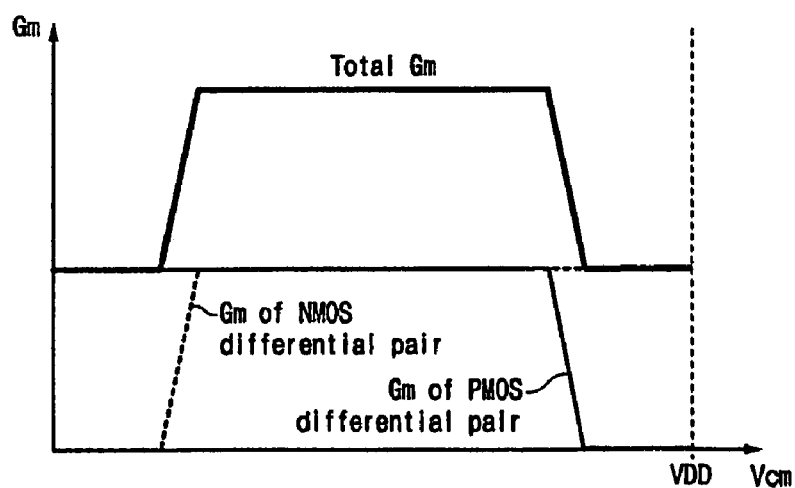
FIG. 2 shows a graph on the variations of the transconductance with respect to the common mode voltage of the conventional RTR differential input stage.
Figure 4:
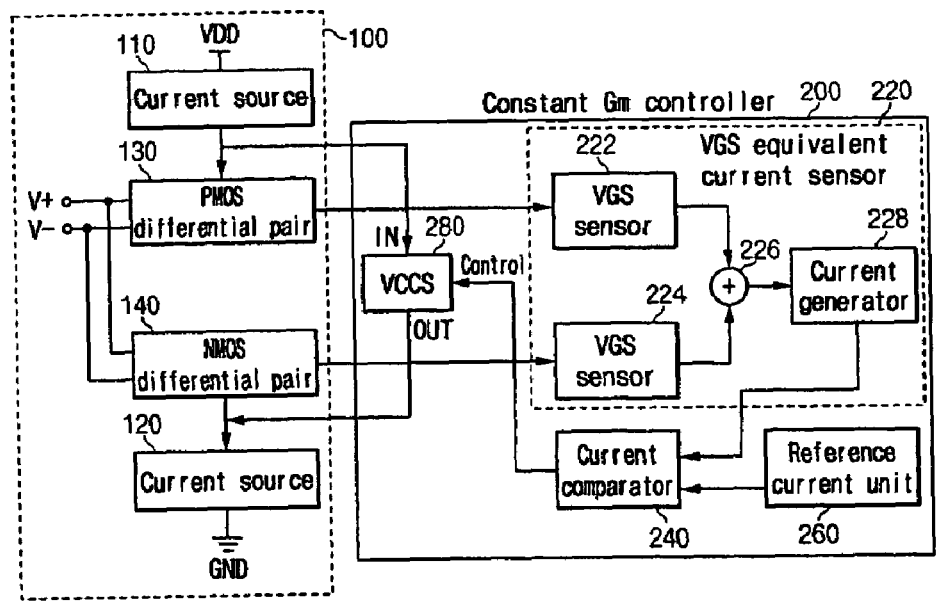
FIG. 4 shows a block diagram of an RTR differential input stage having constant transconductance according to an embodiment of the present invention.

FIG. 4 shows a block diagram of a differential input stage with an essentially constant Gm according to an embodiment of the invention. The differential input stage is driven by two current sources 110 and 120, and includes differential input stage 100 including PMOS differential pair 130 and NMOS differential pair 140, and a controller 200 for maintaining the Gm of the differential input stage. The operation and functions of the PMOS and NMOS differential pairs of FIG. 4 are analogous to those in FIG. 1 and hence their description will not be repeated here.

Controller 200 includes a VGS equivalent current sensor 220, a current comparator 240, a reference current unit 260, and a VCCS (voltage controlled current source) 280. VGS equivalent current sensor 220 includes two VGS sensors 222 and 224, a voltage adder 226, and a current generator 228. VGS sensors 222 and 224 are respectively coupled to a PMOS transistor of PMOS differential pair 130 and an NMOS transistor of NMOS differential pair 140 to sense the corresponding gate-source voltages. Voltage adder 226 adds the voltages sensed by VGS sensors 222 and 224, and current generator 228 converts the added voltages into a current. Current comparator 240 compares the current generated by current generator 228 with a reference current. An output of current comparator 240 controls VCCS 280. VCCS 280 is coupled between current sources 110 and 120 and controls the currents to maintain a steady VGS,n+ VGS,p over the whole range of common mode voltage Vcm.

Figure 5:
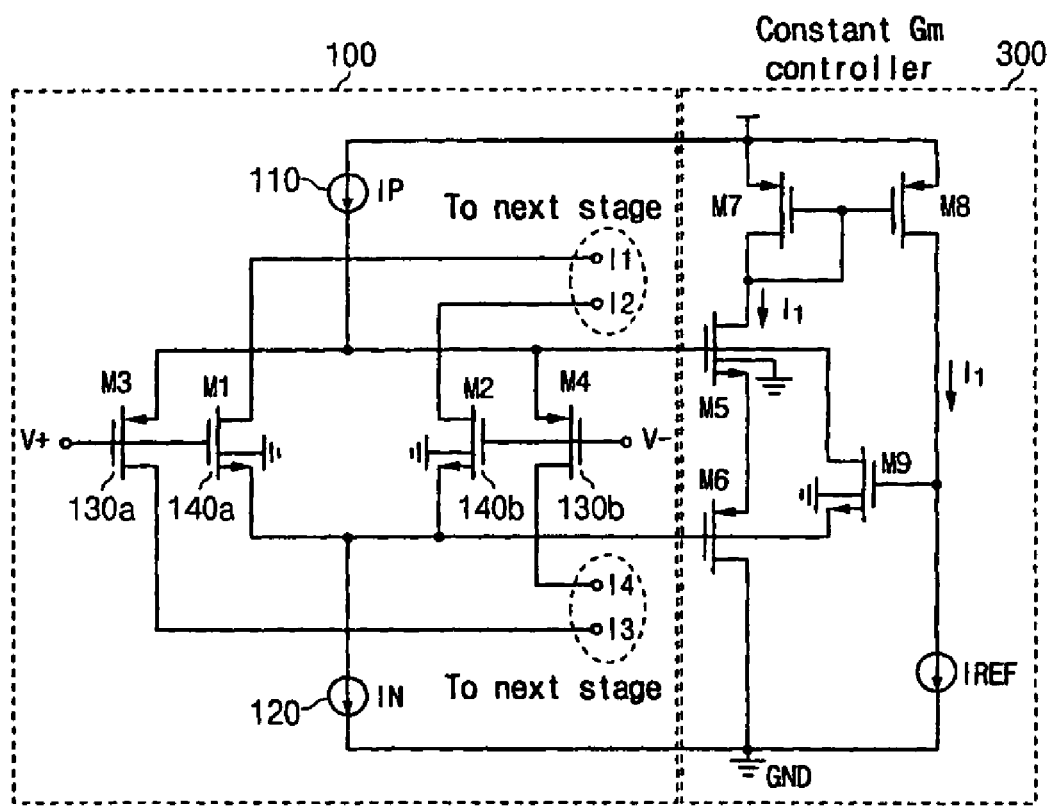
FIG. 5 shows a detailed schematic diagram of an RTR differential input stage having constant transconductance according to an embodiment of the present invention.

FIG. 5 shows a schematic diagram of a differential input stage with constant Gm according to an embodiment of the invention.

The differential input stage is driven by current sources 110 and 120, and comprises a differential input stage including an NMOS differential pair, consisting NMOS transistors M1 and M2 (140a and 140b) and a PMOS differential pair, consisting PMOS transistors M3 and M4 (130a and 130b), and a Gm controller 300 including two NMOS transistors M5 and M9, three PMOS transistors M6, M7, and M8 and a reference current IREF unit. Transistors M1 to M4 (140a, 140b, 130a, 130b) form the differential input stage. Their operation and functions are analogous to that of FIG. 1, and will not be repeated here.

A gate of transistor M5 is coupled to the sources of PMOS transistors 130a and 130b, and a gate of the transistor M6 is coupled to sources of NMOS transistors 140a and 140b. The aspect ratio of transistor M5 corresponds to those of transistors M1 and M2 (140a and 140b), and the aspect ratio of transistor M6 corresponds to those of transistors M3 and M4 (130a and 130b) so that the gate-source voltages of transistors M5 and M6 correspond to common mode gate-source voltages of transistors M1 and M3 (140a and 130a), and M2 and M4 (140b and 130b), respectively. With this choice of aspect ratios, transistors M5 and M6 sense gate-source voltages VGS,n and VGS,p, respectively, and generate currents proportional to VGS,n+VGS,p. Therefore, transistors M5 and M6 perform the function of VGS sensors 222 and 224.

The currents proportional to VGS,n+VGS,p, generated by the transistors M5 and M6, are duplicated by transistors M7 and M8 at the drain of transistor M8. Therefore, transistors M7 and M8 function as a current mirror. Transistor M8 compares the current duplicated by the current mirror to reference current IREF by coupling the drain of transistor M8 to the source of reference current IREF. Therefore, transistor M8 functions as a current mirror and as a current comparator.

Transistor M9 functions as a floating VCCS. The drain of transistor M8 and the gate of transistor M9 are coupled so that a drain current of transistor M9 may be controlled by transistor M8 in order to make the currents of transistors M5 and M6 and the reference current IREF essentially identical. Transistor M9 controls current sources IP 110 and IN 120 by respectively coupling the drain and the source of transistor M9 to the sources of PMOS transistors 130a and 130b and the sources of the NMOS transistors 140a and 140b. As a result, transistors M1 to M4 are biased to satisfy Equation 9, thereby forming a differential input stage with an essentially constant Gm.

Referring to FIG. 5, transistors M9, M5, M7, and M8 form a negative feedback loop, and transistors M9, M6, M5, M7, and M8 form another negative feedback loop. Since the loops only have a single high impedance node at the drain of transistor M8, the operation of constant Gm controller 300 is stable.

When the PMOS and NMOS differential pairs are operated, Gm controller 300 controls the bias currents of transistors M1 to M4 to follow the reference current IREF. When only one of the two differential pairs is operated, the bias currents of transistors M1 to M4 are changed to 4*IREF, through the influence of transistor M9. In these cases currents IP 110 and IN 120 are eight times greater than the reference current:

$$IP = IN = 8IREF \qquad (10)$$

Therefore, the transconductance Gm of the differential input stage is given by Equation 11 or 12:

$$Gm = 2\sqrt{2\mu_n Cox\left(\frac{W}{N}\right)_n IREF} \qquad (11)$$

or $$Gm = 2\sqrt{2\mu_p Cox\left(\frac{W}{N}\right)_p IREF} \qquad (12)$$

Isolated NMOS transistors and isolated PMOS transistors in the general CMOS (complementary MOS) process are not used together. A body of an NMOS transistor is predefined as the lowest voltage level in the CMOS process that uses a p-substrate. Hence, the threshold voltages of NMOS transistors having different source voltage levels become different, and errors may occur when transistors M5 and M6 sense VGS,n and VGS,p, respectively. These errors may increase the variations of the transconductance of the common mode voltage.

To overcome the errors of the CMOS transistor, a replica biasing technique for generating the reference current IREF is used, which will now be described.

Figure 6:
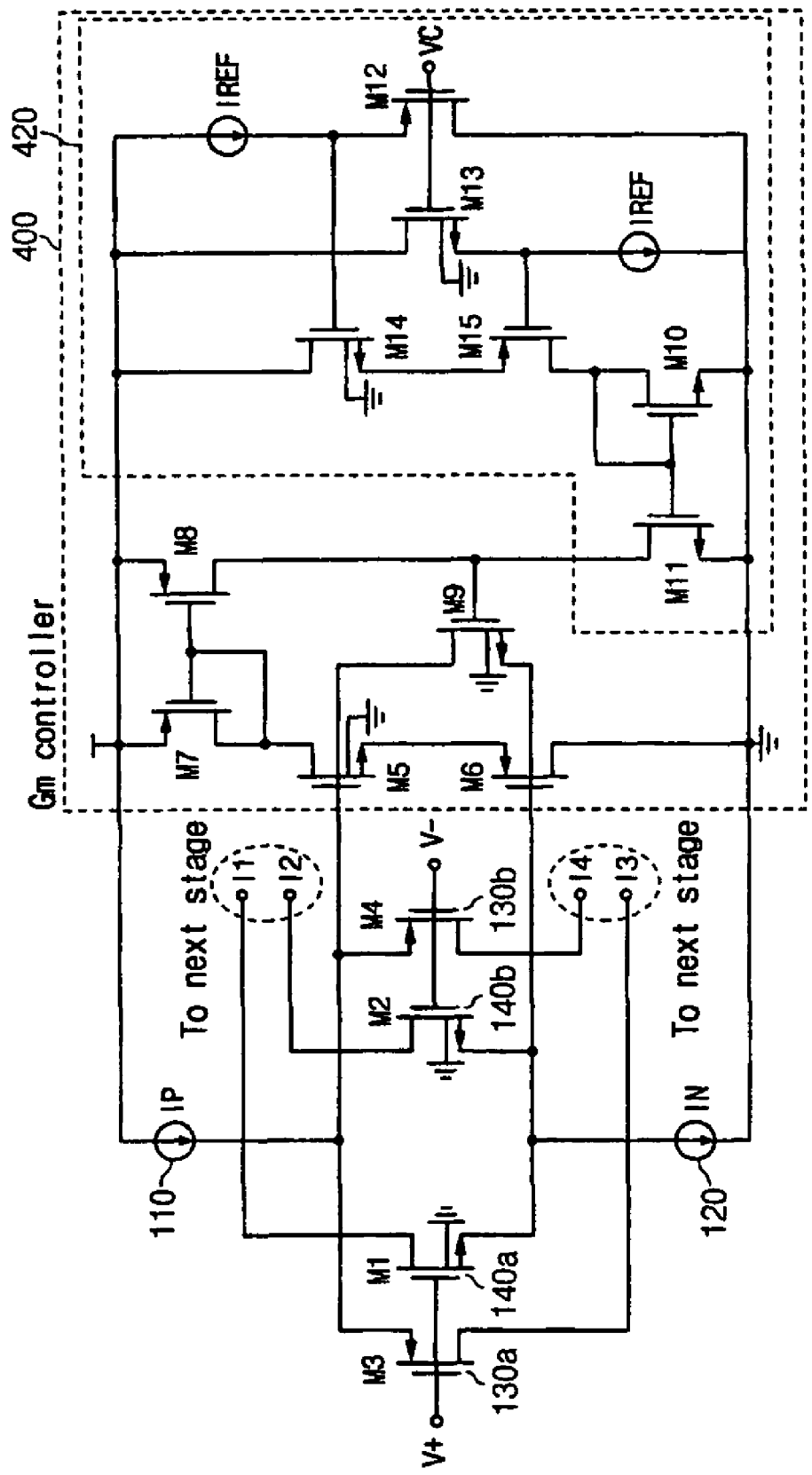
FIG. 6 shows a detailed schematic diagram of an RTR differential input stage having constant transconductance according to an embodiment of the present invention.

FIG. 6 shows a schematic diagram of an RTR differential input stage having essentially constant Gm using the replica biasing technique according to an embodiment of the invention. The embodiment of FIG. 6 corresponds to the embodiment of FIG. 5, except a biasing circuit 420, which generates reference current IREF through a replica biasing technique. Hence the other parts of the embodiment of FIG. 6 will not be described.

Biasing circuit 420 will now be described in detail. Biasing circuit 420 includes NMOS transistors M10, M11, M13, and M14, and PMOS transistors M12 and M15. Transistors M12, M13, M14, and M15 generate reference current IREF. The aspect ratios of transistors M12 and M15 correspond to those of transistors M3 130a and M4 130b, and the aspect ratios of transistors M13 and M14 correspond to those of transistors M1 140a and M2 140b. Transistors M12 and M13 are biased to the reference current IREF. Therefore, when the currents generated by transistors M5 and M6 correspond to the currents generated by transistors M14 and M15, the negative feedback loop allows the PMOS and NMOS differential pairs of the RTR differential input stage to satisfy Equation 9. The gates of transistors M12 and M13 are coupled to the bias voltage VC, which has a value between VA and VB. Transistors M10 and M11 form a current mirror to duplicate reference current IREF.

Even though mismatched states of the threshold voltages are compensated by using the replica biasing technique, the circuit of FIG. 6 requires several processes to reduce variations of Gm induced by variations of the common mode voltage Vcm and the supplied power. Since the gate-source voltages of transistors M1 and M3 (140a and 130a) are reduced in the case of a low common mode voltage Vcm, the difference of the source voltages between NMOS and PMOS differential pairs is reduced. As a result, the drain current of transistor M8 is reduced in proportion to variations of Vcm, and a sink current by transistor M9 is also reduced. Therefore, the NMOS and PMOS differential pairs are biased to be higher than reference current IREF. To solve this problem, the reference current IREF is reduced in proportion to the common mode voltage Vcm as described next.

Figure 7:
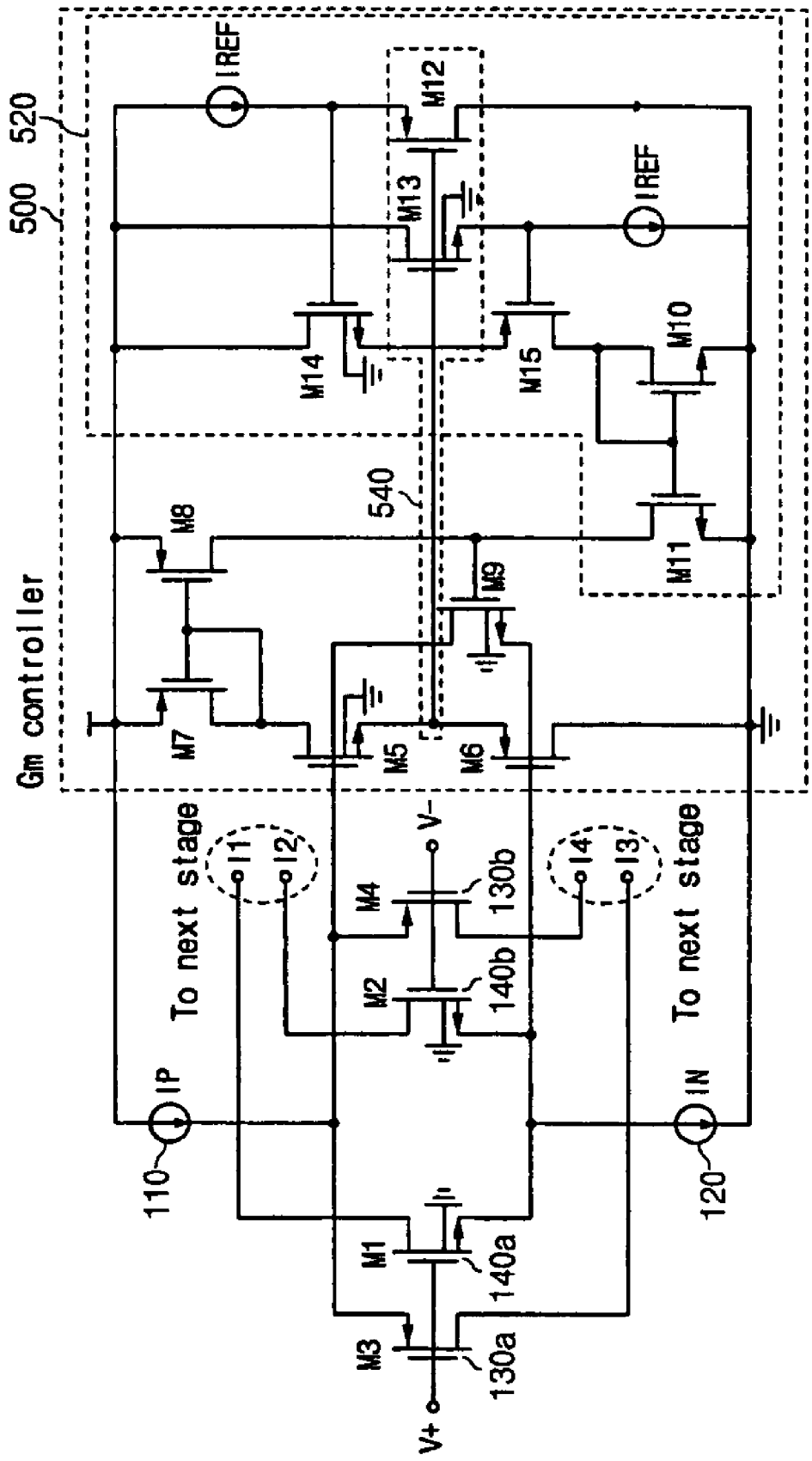
FIG. 7 shows a detailed schematic diagram of an RTR differential input stage having constant transconductance according to an embodiment of the present invention.

FIG. 7 shows a detailed schematic diagram of an RTR differential input stage with an essentially constant transconductance using a dynamic biasing technique according to an embodiment of the invention.

The circuit of FIG. 7 is analogous to the circuit of FIG. 6, and the description of the corresponding parts will not be repeated here. In addition, the circuit of FIG. 7 contains a connection structure 540 of transistors M12 and M13.

The gates of transistors M12 and M13 are not coupled to the constant voltage VC, in contrast to FIG. 6. Instead, the gates of transistors M12 and M13 are coupled between the sources of transistors M5 and M6. Therefore, a node voltage of connection structure 540 essentially corresponds to the common mode voltage Vcm. Hence, since the currents generated by transistors M14 and M15 follow the common mode voltage Vcm, the currents generated by transistors M14 and M15 through the coupling are reduced in proportion to the common mode voltage Vcm, and compensate for the variations of Gm.

Figure 8:
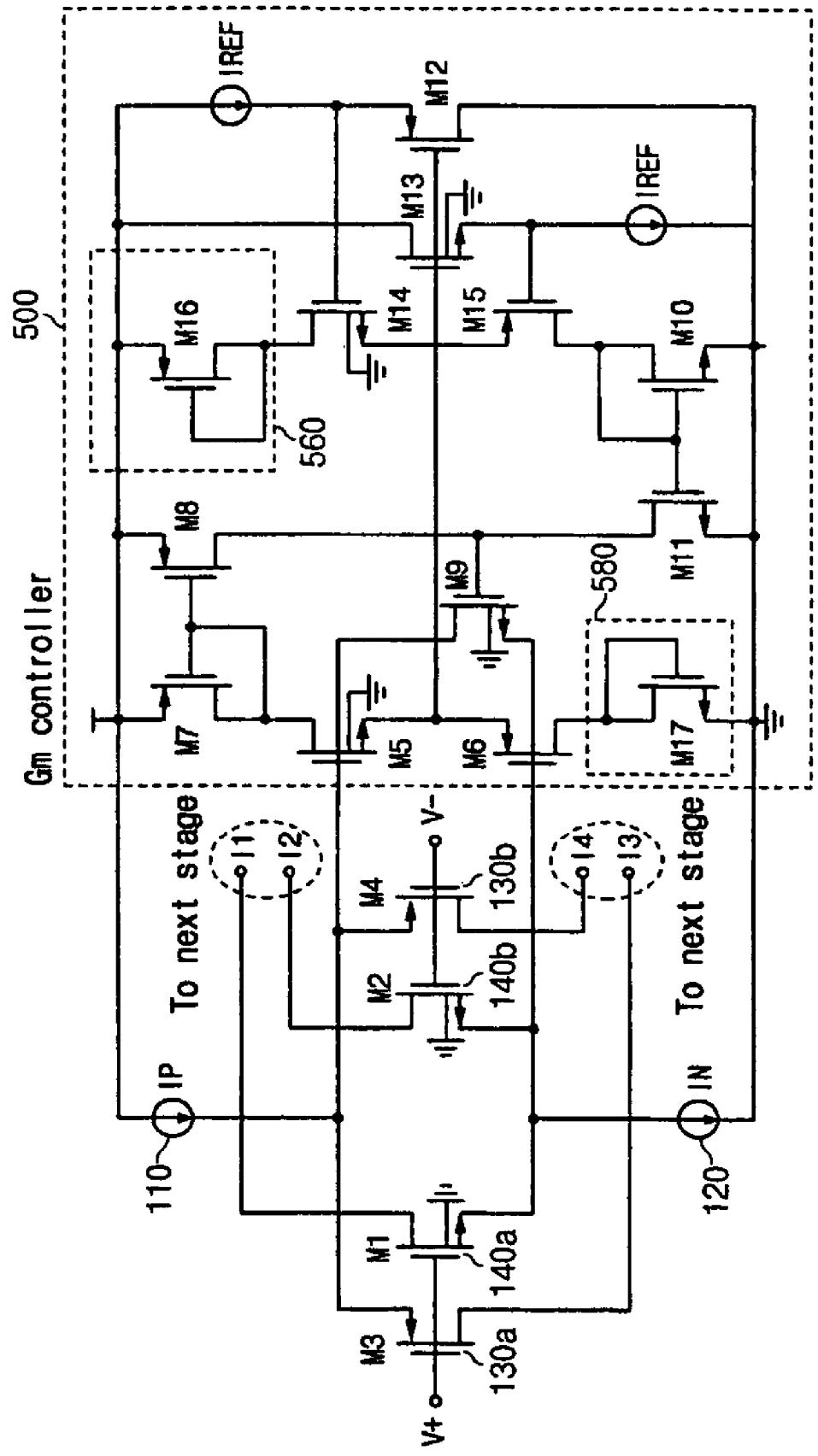
FIG. 8 shows a detailed schematic diagram of an RTR differential input stage having constant transconductance according to an embodiment of the present invention.

FIG. 8 shows an RTR differential input stage with an essentially constant Gm with improved matching characteristics according to an embodiment of the invention. No repeated portions except transistors M16 and M17 560 and 580 will be described.

A gate and a drain of respective transistors M16 and M17 are coupled to each other, making the transistors diode-connected. Transistor M16 560 is coupled between a power line and a drain of transistor M14, and transistor M17 580 is coupled between the drain of transistor M6 and the ground. Transistors M16 and M17 560 and 580 improve the matched state between the VGS sensor and the reference current generator.

Figure 9:
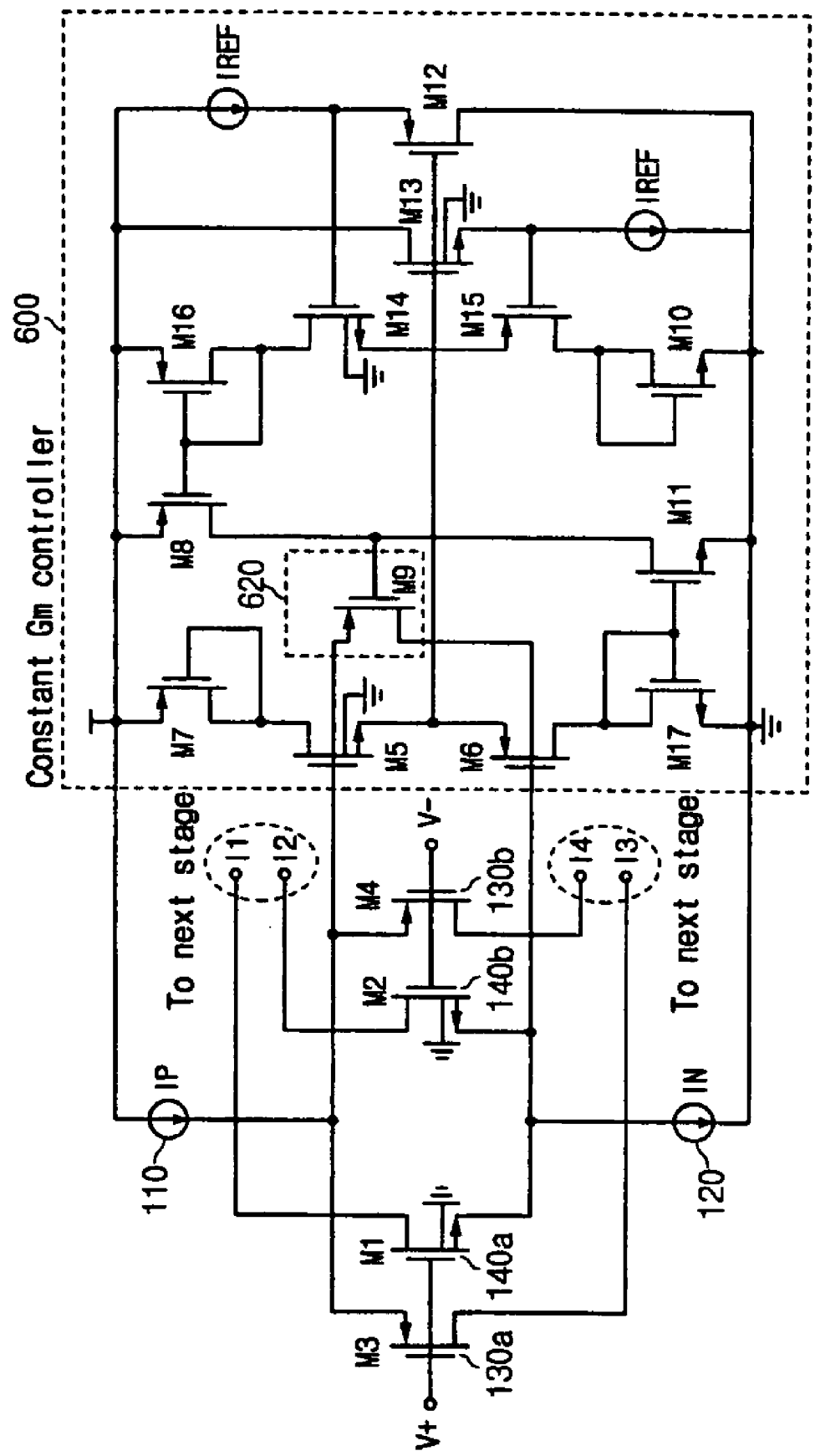
FIG. 9 shows a schematic diagram of an RTR differential input stage having constant transconductance by substituting a PMOS transistor for an NMOS transistor that has a voltage control current source function of FIG. 8.

FIG. 9 shows a schematic diagram with a substitute PMOS transistor 620 for transistor M9 of FIG. 8. The positions of the current mirrors and the circuit for improving the matching between the VGS sensor and the reference current generator are changed as shown in FIG. 9, to generate a negative feedback loop. This change is performed because transistor M9 was also acting as a floating VCCS in FIG. 8.

Figure 10:
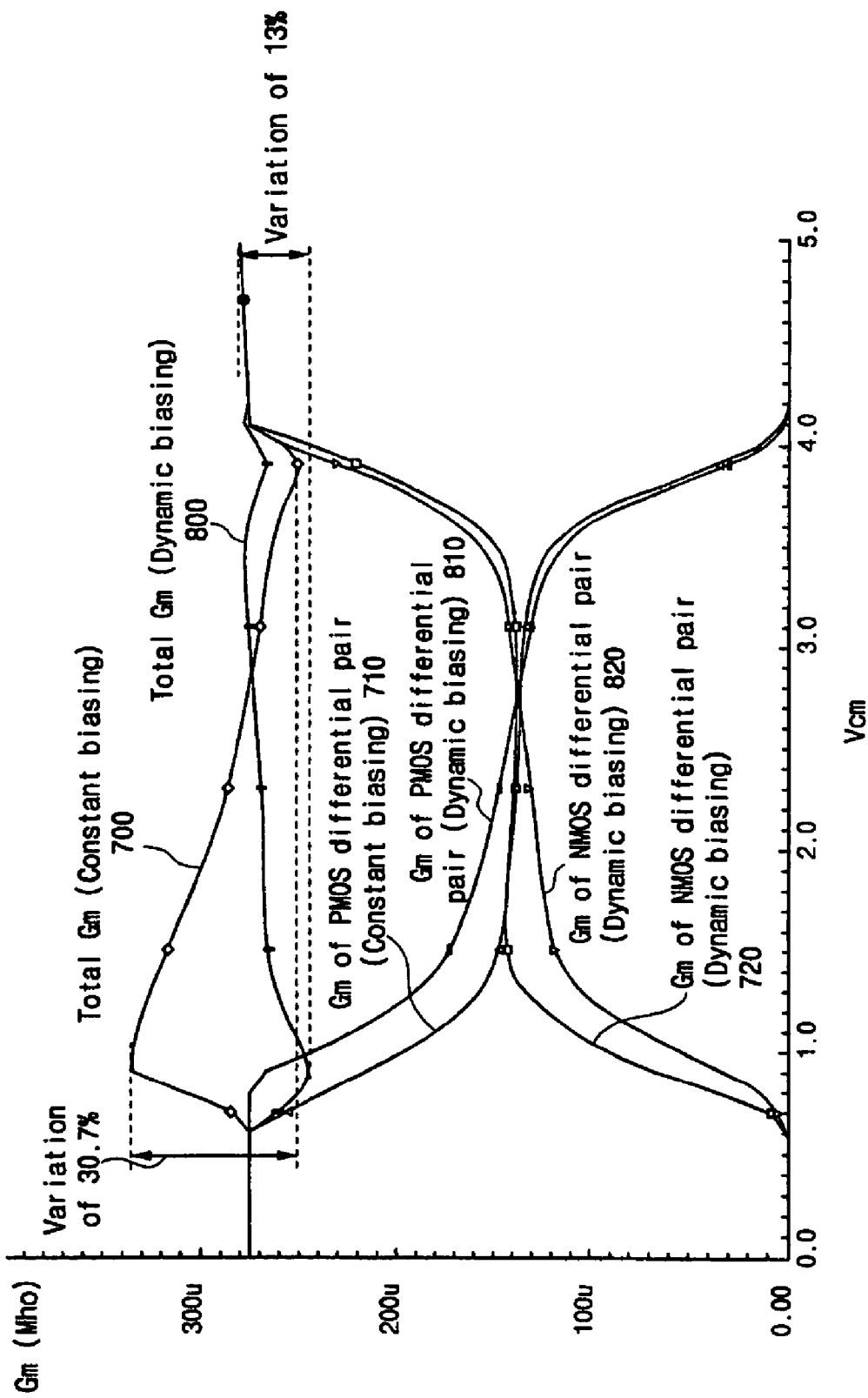
FIG. 10 shows simulation results of FIGS. 6 and 7.

FIG. 10 shows the results of simulations of some embodiments. The simulations used a power supply voltage VDD of 5V. Transistors of model number BSIM3V3 were used to simulate the CMOS transistors. Traces 700, 710 and 720 refer to the embodiment of FIG. 6. Trace 700 indicates the total transconductance Gm, trace 710 indicates the Gm of the PMOS differential pair, and trace 720 indicates the Gm of the NMOS differential pair. Traces 800, 810, and 820 refer to the embodiment of FIG. 7. Trace 800 indicates the total Gm, trace 810 indicates the Gm of the PMOS differential pair, and trace 820 indicates the Gm of the NMOS differential pair.

As shown, in both embodiments the RTR differential input stages have an essentially constant Gm. The simulation result of the embodiment of FIG. 6 shows that Gm has a variation of about 30% with respect to Vcm. The simulation result of the embodiment of FIG. 7 shows the variation of Gm to be about 13% with respect to Vcm. Therefore, embodiments with dynamic biasing produce less variations of Gm.

As described, in order to maintain a steady transconductance of the RTR differential input stage, the gate-source voltages of the first and second differential pairs are sensed, they are compared with the reference current, and the current flowing to the differential pairs is controlled. Therefore, the RTR differential input stage has less variations in its transconductance.

Also, variations of the transconductance can be further reduced by implementing a biasing technique and a matching technique.

While this invention has been described in terms of certain embodiments, it is to be understood that the invention is not limited to the disclosed embodiments, but, on the contrary, is intended to cover various modifications and equivalent arrangements, included within the spirit and scope of the appended claims.

What is claimed is:

1. A transconductance control circuit of a rail-to-rail differential input stage, comprising:
    a rail-to-rail differential input stage including a first and a second differential pair;
    a current supply unit coupled to sources of the first and second differential pairs, for supplying a bias current; and
    a transconductance controller for respectively sensing a first gate-source voltage of the first differential pair and a second gate-source voltage of the second differential pair, for comparing a reference current with a current that corresponds to sum of the first gate-source voltage and the second gate-source voltage, and for controlling currents of the first and second differential pairs according to the comparison.

2. The transconductance control circuit of claim 1, wherein
    the first and second differential pairs comprise transistors, and
    the transistors of the first and second differential pair have different conduction types.

3. The transconductance control circuit of claim 2, wherein the transistors of the first differential pair are n-type, and the transistors of the second differential pair are p-type.

4. The transconductance control circuit of claim 2, wherein the transconductance controller comprises:
    a gate-source voltage equivalent current sensor for respectively sensing a first gate-source voltage of the first differential pair and a second gate-source voltage of the second differential pair, and for generating a current that corresponds to the sum of the first gate-source voltage and the second gate-source voltage;
    a current comparator for comparing the current of the gate-source voltage equivalent current sensor with the reference current; and
    a voltage controlled current source for controlling the currents of the first and second differential pairs according to the output of the current comparator.

5. The transconductance control circuit of claim 4, wherein the gate-source voltage equivalent current sensor comprises:
    a first gate-source voltage sensor for sensing the first gate-source voltage of the first differential pair;
    a second gate-source voltage sensor for sensing the second gate-source voltage of the second differential pair;
    an adder for summing an output of the first gate-source voltage sensor and an output of the second gate-source voltage sensor; and
    a current generator for converting a voltage that corresponds to an output of the adder into a current.

6. The transconductance control circuit of claim 5, wherein the reference current is greater than about eight times the current of a power supply unit.

7. The transconductance control circuit of claim 4, wherein the gate-source voltage equivalent current sensor comprises:

a first transistor coupled to a source of the second differential pair, for sensing the second gate-source voltage of the second differential pair; and a second transistor having a gate coupled to a source of the first differential pair, for sensing the gate-source voltage of the first differential pair, wherein sources of the first and second transistors are coupled with each other to generate a current proportional to the sum of the first gate-source voltage and the second gate-source voltage.

8. The transconductance control circuit of claim 7, wherein the current comparator comprises:

a third transistor having a gate and a drain coupled to a drain of the first transistor; and a fourth transistor having a gate coupled to a gate of the third transistor, and a drain coupled to the reference current; and wherein the current comparator duplicates a current proportional to the sum of the first gate-source voltage and the second gate-source voltage, and compares the current with the reference current.

9. The transconductance control circuit of claim 7, wherein the voltage controlled current source comprises a fifth transistor having a gate coupled to the drain of the fourth transistor, a drain coupled to the source of the second differential pair, and a source coupled to the source of the first differential pair, wherein the voltage controlled current source controls the currents of the first and second differential pairs.

10. The transconductance control circuit of claim 9, wherein the transconductance controller further comprises a reference current generator for generating the reference current.

11. The transconductance control circuit of claim 10, wherein the reference current generator of the transconductance controller comprises:

a sixth and a seventh transistor, forming a current mirror, having an output end coupled to the gate of the fifth transistor, the current mirror providing the reference current;

an eighth and a ninth transistor, having gates coupled to each other, and sources coupled to a first and a second reference current source respectively, the coupled gates being coupled to a bias voltage;

a tenth transistor, having a gate coupled to the source of the eighth transistor; and an eleventh transistor, having a gate coupled to the source of the ninth transistor, a source coupled to a source of the tenth transistor, and a drain coupled to the drain of the sixth transistor, the eighth to eleventh transistors supplying the reference current, and the sixth and seventh transistors duplicating the reference current to perform a replica biasing technique.

12. The transconductance control circuit of claim 11, wherein the bias voltage has a value between a summed value of the gate-source voltage of the first differential pair and an operating voltage of the current supply unit of the first differential pair, and a summed value of the gate-source voltage of the second differential pair and an operating voltage of the current supply unit of the second differential pair.

13. The transconductance control circuit of claim 12, wherein the fifth transistor is an NMOS transistor.

14. The transconductance control circuit of claim 10, wherein the reference current generator of the transconductance controller comprises:

a sixth and a seventh transistor, forming a current mirror having an output end coupled to the gate of the fifth transistor, the current mirror providing the reference current;

an eighth and a ninth transistor, having gates coupled to each other and coupled to the sources of the fifth transistors, and having sources respectively coupled to a first and a second reference current source;

a tenth transistor, having a gate coupled to the source of the eighth transistor; and an eleventh transistor, having a gate coupled to the source of the ninth transistor, a source coupled to a source of the tenth transistor, and a drain coupled to the drain of the sixth transistor, the eighth to eleventh transistors supplying the reference current, and the sixth and seventh transistors duplicating the reference current to perform a dynamic biasing technique.

15. The transconductance control circuit of claim 14, wherein the transconductance controller further comprises:

a twelfth transistor having a gate and a drain coupled to each other, the drain being coupled to the drain of the tenth transistor, and a source coupled to the current supply unit for producing an essentially matching state between the gate-source voltage equivalent current sensor and the reference current generator; and a thirteenth transistor having a gate and a drain coupled to each other, the drain being coupled to the drain of the second transistor, and a grounded source for producing an essentially matching state between the gate-source voltage equivalent current sensor and the reference current generator.

* * * * *